United States Patent

Hayashi

[11] Patent Number: 5,982,240
[45] Date of Patent: Nov. 9, 1999

[54] VOLTAGE CONTROLLED OSCILLATOR USING A PLURALITY OF SWITCHABLE OSCILLATORS

[75] Inventor: Katuhiko Hayashi, Chiba, Japan

[73] Assignee: TDK Corporation, Tokyo, Japan

[21] Appl. No.: 08/979,780

[22] Filed: Nov. 26, 1997

[30] Foreign Application Priority Data

Nov. 27, 1996 [JP] Japan ................................. 8-316408

[51] Int. Cl.⁶ ........................................... H03B 21/01
[52] U.S. Cl. ............................. 331/40; 331/43; 331/48; 331/49
[58] Field of Search .................. 331/46, 48, 49, 331/56, 37, 40, 42, 43

[56] References Cited

U.S. PATENT DOCUMENTS 4,061,973 12/1977 Reimers et al. ......................... 331/18

FOREIGN PATENT DOCUMENTS

| 0 696 843 | 2/1996 | European Pat. Off. . |
| 0 718 964 | 6/1996 | European Pat. Off. . |
| 3307 255 | 9/1984 | Germany . |
| 61-64723 | 5/1986 | Japan . |
| 1 173 908 | 7/1989 | Japan . |
| 1-27302 | 8/1989 | Japan . |

OTHER PUBLICATIONS

Max E. Peterson, Electronics, vol. 40, No. 8, pp. 90–91, "Isolated Multiple Oscillators Provide Wide Frequency Range", Apr. 17, 1967.

Primary Examiner—Siegfried H. Grimm
Attorney, Agent, or Firm—Oblon, Spivak, McClelland, Maier & Neustadt, P.C.

[57] ABSTRACT

A voltage controlled oscillator comprises first oscillating stage for outputting a first frequency signal, second oscillating stage for outputting a second frequency signal different from the first frequency signal, a buffer stage connected with said first and second oscillating stages, the buffer stage receiving said first and second frequency signals to generate an output signal.

4 Claims, 4 Drawing Sheets

VOLTAGE CONTROLLED OSCILLATOR USING A PLURALITY OF SWITCHABLE OSCILLATORS

BACKGROUND OF THE INVENTION

The present invention relates to a voltage controlled oscillator usable in the field of a wireless installation such as a portable telephone and an automobile telephone and also usable in the field of various electric installations. More particularly, the present invention relates to a voltage controlled oscillator suitable for a communication system in which a plurality of frequency bands are used.

Concerning the conventional voltage controlled oscillator having a function of changing over the oscillating frequency band, there are provided a first conventional example shown in FIG. 5 and a second conventional example shown in FIG. 6. The first conventional example is described in Japanese Postexamined Utility Model Publication 1-27302 as a conventional example. Also, the first conventional example is described in Japanese Unexamined Utility Model Publication 61-64723 as a conventional example. In this first conventional example, a PIN diode is used. When a voltage impressed upon this PIN diode is turned on and off so that a constant of a peripheral element of the oscillating transistor can be changed, the oscillating frequency band is changed over.

The first conventional example shown in FIG. 5 will be explained below in more detail. In the drawing, C0 to C9, Ca and Cb are capacitors, R1 to R7 are resistors, L0 and L1 are coils, S1 is a strip line composing a resonator, Cv is a variable capacitance diode, Q1 and Q2 are transistors, and Pd is a PIN diode. Reference numeral 1 is a power supply terminal, reference numeral 2 is a frequency control terminal, reference numeral 3 is an output terminal for an oscillated signal, and reference numeral 4 is a changeover terminal of the oscillating frequency band. Transistor Q1 and its peripheral section compose an oscillating stage 5, and transistor Q2 and its peripheral section compose a buffer stage 6.

Operation of the voltage controlled oscillator shown in FIG. 5 will be explained as follows. The oscillating stage 5 is set into oscillation as follows. Electric power is supplied from the power supply terminal 1 to transistor Q1. Further, an arbitrary intensity of voltage is supplied from the frequency control terminal 2 to variable capacitance diode Cv via coil L0. At this time, the oscillating stage 5 is set into oscillation, wherein the oscillating frequency is determined by a relation between the capacitance of the variable capacitance diode Cv and the constants of other capacitors of the oscillating stage 5 and the strip line S1.

At this time, when a voltage is applied upon the oscillating frequency changeover terminal 4, the PIN diode Pd is turned on. Therefore, capacitor Cb is electrically neglected, and the grounding capacitance provided in parallel with strip line S1 is composed of only capacitor Ca.

On the other hand, when a voltage is not applied upon the oscillating frequency changeover terminal 4, the PIN diode Pd is in off-state. Therefore, the grounding capacitance provided in parallel with strip line S1 is composed of a composite capacitance of series connection in which capacitors Ca and Cb are connected in series. This composite capacitance (Ca·Cb/(Ca+Cb)) is necessarily smaller than the capacitance of capacitor Ca.

Therefore, it is possible for the oscillating stage 5 to oscillate two oscillating bands in accordance with the voltage applied upon the oscillating frequency band changeover terminal 4. In this case, the oscillating frequency band in the case of applying a voltage upon the oscillating frequency band changeover terminal 4 is lower than the oscillating frequency band in the case of not applying a voltage upon the oscillating frequency band changeover terminal 4.

A signal generated in the oscillating stage 5 is inputted into the buffer stage 6 via capacitor C5. In the buffer stage 6, electric power is supplied from the power supply terminal 1 to transistor Q2, so that transistor Q2 can be driven. The buffer stage 6 functions as follows. The buffer stage 6 amplifies an inputted signal and stabilizes the oscillating operation in the case of mismatching of impedance between the oscillator and the outside of the oscillator. Also, the buffer stage 6 stabilizes the oscillating operation in the case of fluctuation of impedance.

As shown in FIG. 6, there is proposed a system in which two sets of voltage controlled oscillator, the oscillating frequency bands of which are different from each other, are used, and they are changed over so as to output a signal.

Operation is conducted as follows in the second example shown in FIG. 6. Reference numerals 7 and 8 are voltage controlled oscillators which respectively oscillate signals of different frequencies. When one voltage controlled oscillator 7 is used, it is connected with the power supply terminal 1, frequency control terminal 2 and output terminal 3 via the respective switches 9, 10 11. When the other voltage controlled oscillator 8 is used, the switches 9, 10, 11 are changed over to the side of the voltage controlled oscillator 8.

In the conventional example shown in FIG. 5, the following problems may be encountered. It is possible to oscillate signals of different frequency bands when constants of some elements are changed by switching operation. However, according to the above arrangement, it is difficult to oscillate a signal by changing over the frequency band between two frequency bands in such a manner that one frequency band is twice as high as the other frequency band.

In the first conventional example, in the design of C/N characteristic, which expresses an intensity of phase noise of an oscillating signal, which is an important characteristic of the voltage controlled oscillator, if C/N characteristic is optimized in one of the frequency bands, it becomes difficult to optimize C/N characteristic in other frequency band. That is, it is difficult to design C/N characteristic to be optimized in both frequency bands. Therefore, the design of C/N characteristic is necessarily conducted to take trade-off optimizing conditions in both frequency bands. For the above reasons, it is impossible to put the above frequency controlled oscillator into practical use in which a high C/N characteristic is required.

When the voltage controlled oscillators are mass-produced, the oscillating frequencies of the voltage controlled oscillator are uneven in a wide range. Therefore, it is necessary to adjust the oscillating frequencies. When the oscillating frequency is adjusted so as to ensure a necessarily high accuracy of the oscillating frequency, which is not higher than 0.1% with respect to the oscillating frequency of a usual mass-produced product, it is necessary to obtain the accuracy by both frequencies to be changed over. However, since the respective oscillating frequencies are oscillated by the same oscillating stage 5, when one oscillating frequency is adjusted, it is necessary to watch the other oscillating frequency. For the above reasons, the method of adjusting the oscillating frequency is complicated.

On the other hand, in the second conventional example, there are respectively provided independent voltage controlled oscillators. Therefore it is possible to solve the above problems caused when the same oscillating stage is used. However, in the second conventional example, two sets of voltage controlled oscillators are used. Accordingly, there is a tendency that the size of the functional block of the second conventional example becomes larger than that of the first conventional example described before.

Further, in the second conventional example, it is necessary to provide a plurality of switches for changing over the terminals of the voltage controlled oscillators. In order to change over the switches, it is necessary to provide a circuit. Therefore, the size of the functional block of the second conventional example is further increased.

SUMMARY OF THE INVENTION

The present invention has been accomplished to solve the above problems of the conventional examples. It is an object of the present invention to provide a voltage controlled oscillator capable of independently optimize the characteristics such as C/N characteristic in a plurality of oscillating frequency bands, wherein the size of the voltage controlled oscillator is small and the voltage controlled oscillator has no switches of complicated structure.

The present invention is to provide a voltage controlled oscillator comprising: at least two oscillating stages to oscillate a signal in an arbitrary frequency band; and a buffer stage to output a signal, connected with the oscillating stages.

Further, it is provided a voltage controlled oscillator in which the buffer stage has a mixing function, and signals in a plurality of frequency bands are outputted when at least one output signal is inputted into the buffer stage from at least two oscillating. stages connected with the buffer stage and a mixing signal of the signals outputted from the oscillating stages is outputted from the buffer stage.

Furthermore, it is provided a voltage controlled oscillator in which at least two oscillating stages connected with the buffer stage is composed of one oscillating stage directly connected with the buffer stage so as to feed a signal to the buffer stage at all times, and at least one oscillating stage connected with the buffer stage via a switch so as to feed a signal to the buffer stage when necessary.

Furthermore, it is provided a voltage controlled oscillator in which the oscillating stage connected with the buffer stage via the switch is operated in such a manner that the switch is connected being interlocked with the operation of turning on the power source for outputting a signal from the oscillating stage, and the output signal is inputted into the buffer stage.

Still further, it is provided a voltage controlled oscillator in which frequency control of signals in a plurality of frequency bands is conducted only by a frequency control terminal arranged in one oscillating stage directly connected with the buffer stage so as to feed a signal to the buffer stage at all times.

The present invention is to provide a voltage controlled oscillator comprising: a plurality of oscillating stages to oscillate signals in different frequency bands; and one buffer stage connected with the oscillating stages, wherein the output terminals of the plurality of oscillating terminals are respectively connected with the input terminal of the buffer stage by means of capacitive coupling of low capacitance.

Further, according to the present invention, in the voltage controlled oscillator, one oscillating stage, the output of which is inputted into the buffer stage, is selected from a plurality of oscillating stages by turning on and off a power source terminal of the oscillating stage.

Furthermore, according to the present invention, in the voltage controlled oscillator, each oscillating stage has a variable capacitance diode, the oscillating frequency of which is controlled by an applied voltage, and one frequency control terminal is connected with the variable capacitance diode of each oscillating stage.

In the voltage controlled oscillator of the present invention, the oscillating stages are respectively connected with the buffer stage by means of capacitive coupling of low capacitance. Therefore, the impedance between the oscillating stages is very high. Accordingly, when one of the oscillating stages is operated, almost all oscillating signal outputted from the oscillating stage is sent to the buffer stage without flowing into the other oscillating stage. Due to the foregoing, when one oscillating stage is operated and the other oscillating stage is not operated, it is possible to select the oscillating stage without providing a switch between the oscillating stage and the buffer stage. Since each oscillating stage is independent, the characteristic such as C/N characteristic can be optimized for each oscillating stage by adjusting the constant of each element in accordance with the frequency of a signal oscillated by each oscillating stage. Since each oscillating stage is independent, it is possible to individually adjust the frequency.

When the respective power supply terminals of the plurality of oscillating stages are turned on and off, the oscillating signal of the oscillating stage to be inputted into the buffer stage can be selected. Therefore, only when power supply is turned on and off, the oscillating frequency band can be selected.

Further, the frequency control terminal is commonly provided among the oscillating stages, and the variable capacitance diode, the capacitance of which is changed by an applied DC voltage, is provided in each oscillating stage so as to change the oscillating frequency. It is considered that the variable capacitance diode is a substantial insulator for an applied DC voltage. Accordingly, it is possible to feed a control voltage to the oscillating stage without causing any problem.

DETAILED DESCRIPTION OF THE PREFERRED EMBODIMENT

First Embodiment

Figure 1:
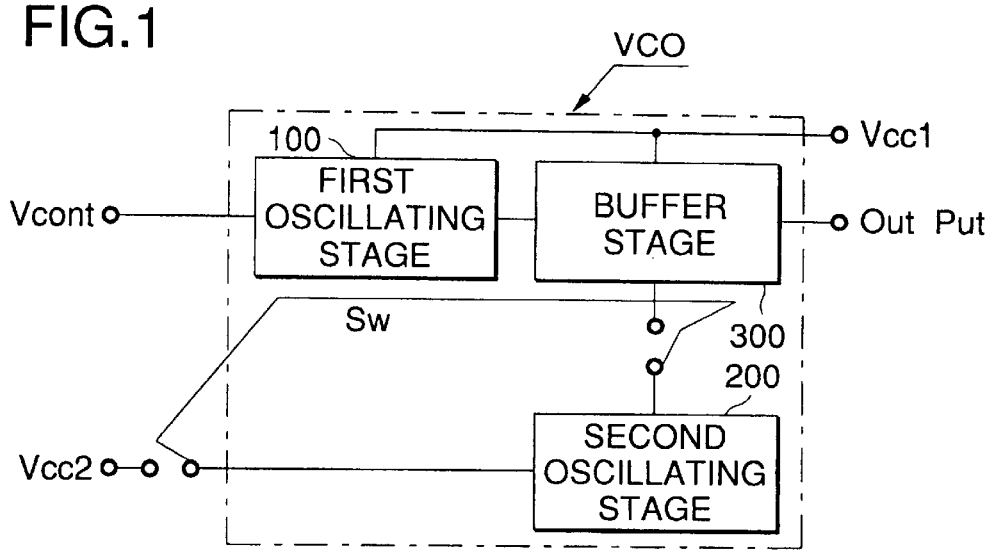
FIG. 1 is a block diagram of a voltage controlled oscillator of the first embodiment of the present invention.

FIG. 1 is a block diagram of a voltage controlled oscillator according to a first embodiment of the present invention.

In the drawing, $V_{cc}1$ is a power supply terminal for driving a first oscillating stage 100 and a buffer stage 300, and $V_{cc}2$ is a power supply terminal for driving a second oscillating stage 200. Reference character $S_w$ represents an interlocking motion with the power supply terminal $V_{cc}2$ for driving.

The voltage controlled oscillator shown in FIG. 1 is operated as follows. First, when electric power is not supplied to $V_{cc}2$, the second oscillating stage 200 is not driven, and switch Sw shown in the drawing is turned off, that is, switch Sw is open. At this time, under the condition that electric power is supplied to $V_{cc}1$, the first oscillating stage 100 and the buffer stage 300 are operated, and a signal, the frequency of which is controlled by frequency control terminal $V_{cont}$ in a frequency band which has been set in the first oscillating stage 100, is outputted from the output terminal $O_{utput}$. In the above condition, voltage controlled oscillator in FIG. 1 is operated in the same manner as that of a conventional voltage controlled oscillator.

Next, when electric power is supplied to electric power terminal $V_{cc}2$ under the condition that electric power is supplied to electric power terminal $V_{cc}1$, the second oscillating stage 200 is driven, and switch Sw arranged between the second oscillating stage 200 and the buffer stage 300 is turned on, that is, switch Sw is short-circuited. Accordingly, a signal oscillated by the second oscillating stage 200 flows into the buffer stage 300. At this time, a signal oscillated by the first oscillating stage 100 also flows into the buffer stage 300. When two signals oscillated by the first and second oscillating stages 100 and 200 flow into the buffer stage 300, mixing (multiplication) occurs in the transistor circuit arranged in the buffer stage 300. As a result, it is possible to obtain a signal in the output terminal $O_{utput}$, the frequency of which is different from the frequencies of the signals oscillated in the first and second oscillating stages 100 and 200. For example, in the case where a signal, the frequency of which is f1, is generated in the first oscillating stage 100 and a signal, the frequency of which is f2, is generated in the second oscillating stage 200, it is possible to obtain a signal, the frequency of which is (f1+f2) or |f1−f2|, in the output terminal $O_{utput}$. Due to the foregoing, it is possible to change over between a plurality of frequency bands. In the above arrangement, the buffer stage also functions as a mixer.

On the other hand, since the oscillating stage 100 is provided with frequency control terminal $V_{cont}$, it is possible to continuously change the frequency of a signal in the frequency band of the oscillating stage 100. On the other hand, the oscillating stage 200 is capable of oscillating a signal of only one arbitrary frequency. Accordingly, the frequency of a signal made by mixing the signals oscillated by the two oscillating stages can be continuously changed in a frequency band which is changed in accordance with the control conducted by frequency control terminal $V_{cont}$ of the oscillating stage 100.

Further, it is possible to set C/N characteristic as follows, which represents an intensity of phase noise of an oscillating signal, which is an important characteristic of voltage controlled oscillator. First, in the first oscillating stage 100, the element constant is determined so that C/N of the oscillating frequency (f1) can be optimized. Next, concerning the frequency (f1+f2) or |f1−f2| generated by mixing the frequencies generated in the first and second oscillating stages 100 and 200, while the element constant in the first oscillating stage 100 is maintained as it is, the element construction of the second oscillating stage 200 is changed, so that C/N characteristic can be optimized.

Referring to the accompanying drawings, an example of the present invention will be explained as follows.

Figure 2:
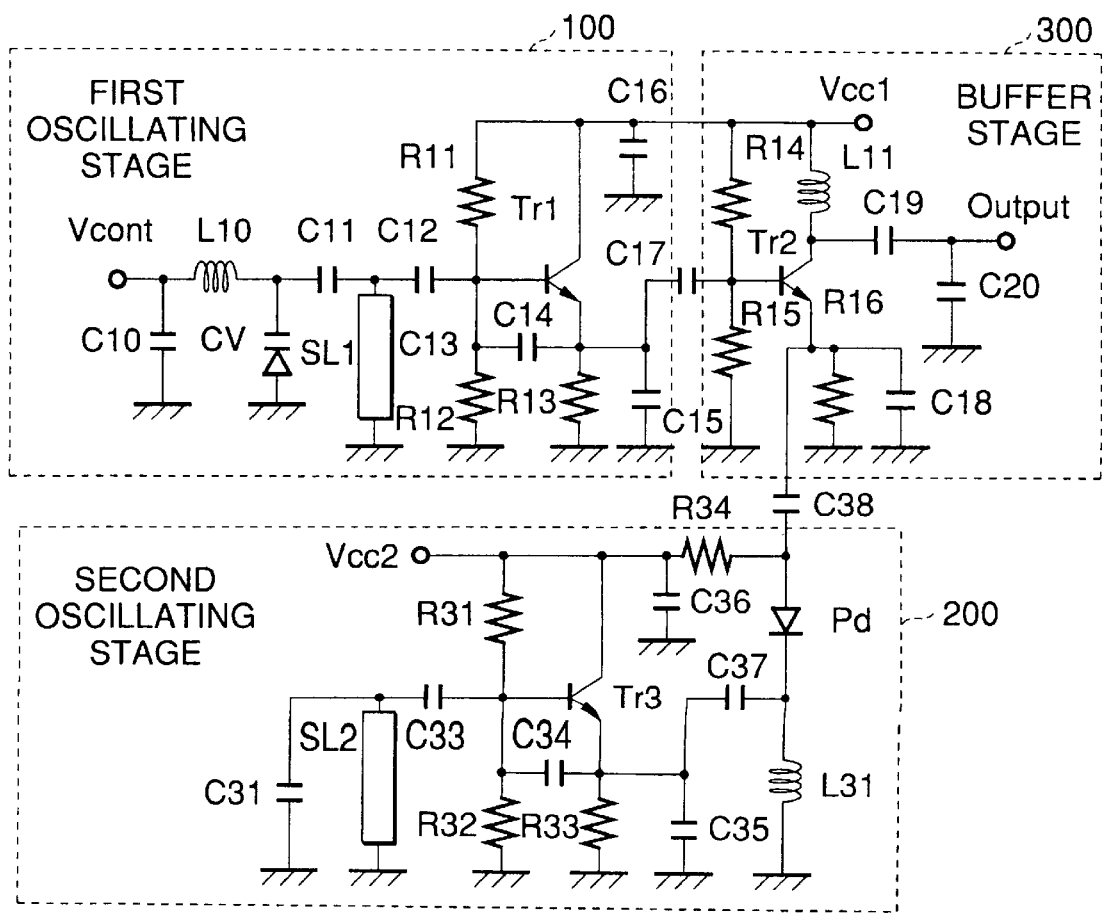
FIG. 2 is a circuit diagram showing the voltage controlled oscillator of the first embodiment of the present invention.

FIG. 2 is a circuit diagram of the example of voltage controlled oscillator of the present invention. In the drawing, R31 to R34 are resistors, L31 is a coil, C31 to C38 are capacitors, and SL1 and SL2 are strip line resonators.

The circuit of this example is composed of three portions as explained in FIG. 1. That is, the circuit of this example includes: a first oscillating stage 100, the primary component of which is transistor Tr1; a second oscillating stage 200, the primary component of which is transistor Tr3; and a buffer stage 300, the primary component of which is transistor Tr2, wherein the buffer stage 300 also functions as a mixer. In FIG. 2, each portion is surrounded by a broken line.

First, the first oscillating stage 100 is explained below. The collector of transistor Tr1 arranged in the first oscillating stage 100 is directly connected with electric power line $V_{cc}1$. Further, the collector of transistor Tr1 is connected with ground via capacitor C16 by means of high frequency grounding. The bias circuit is formed into a voltage feedback bias including: power supply terminal $V_{cc}1$; resistor R11 connected with the base of transistor Tr1; resistor R12 connected with the base of transistor Tr1 and ground; and resistor R13 connected with the emitter of transistor Tr1 and a ground.

The oscillating circuit structure is formed into a circuit structure referred to as a deformation clap oscillating circuit. The oscillating circuit structure is described as follows. Capacitor C14 is connected between the base and the emitter of transistor Tr1; and capacitor C15 is connected between the emitter and the collector of transistor Tr1 in such a manner that one end of capacitor C15 is connected with the emitter of transistor Tr1 and the other end of capacitor C15 is connected with ground, so that the other end of capacitor C15 is connected with the collector of transistor Tr1 via capacitor C16 which is connected with ground in the same manner. Further, the base and the collector of transistor Tr1 are connected with each other, the arrangement of which is described as follows. On the base side of transistor Tr1, there are provided capacitors C11, C12, strip line SL1 connected with the capacitors, and a variable capacitance diode Cv (cathode side) connected with the other terminal of capacitor C11. A terminal of capacitor C12, which is not connected with strip line SL1, is connected with the base of transistor Tr1. The anode of the variable capacitance diode Cv is connected with ground, and also the other terminal of strip line SL1 is connected with ground.

Due to the foregoing arrangement, the base of transistor Tr1 is connected with the collector via capacitor C16 which is subjected to high frequency grounding.

Accordingly, the oscillating frequency, the C/N characteristic of oscillation and the oscillating power are determined by the capacitors and the strip line arranged among the base, emitter and collector of transistor Tr1. A signal oscillated by the oscillating stage 100 is sent out from the emitter of transistor Tr1 via capacitor C17 connected with the emitter and inputted into the successive buffer stage.

When a voltage is applied upon the variable capacitance diode Cv by the frequency control terminal $V_{cont}$, the capacitance is changed, so that the oscillating frequency of the first oscillating stage 100 can be changed. There are provided a capacitor C10 and a coil L10 between the frequency control terminal $V_{cont}$ and the cathode of the variable capacitance diode Cv. Capacitor C10 and coil L10 are arranged so that the oscillating signal can not flow out from the first oscillating stage 100 and so that the first oscillating stage 100 can not be affected by high frequencies given from the outside. That is, capacitor C10 and coil L10 are arranged for the purpose of decoupling. In this connection, coil L10 may affect the oscillating frequency depending upon the setting of its constant.

Next, the second oscillating stage 200 will be explained below. The structure of the second oscillating stage 200 is essentially the same as that of the first oscillating stage 100. The collector of transistor Tr3 provided in this second oscillating stage 200 is directly connected with the power supply line $V_{cc}2$ and also connected with ground via the capacitor C36 by means of high frequency grounding. The bias circuit is formed into an arrangement referred to as a voltage feedback bias. The voltage feedback bias includes: a resister R31 connected between the power supply terminal $V_{cc}2$ and the base of transistor Tr3; a resistor R32 connected between the base of transistor Tr3 and the ground; and a resistor R33 connected between the emitter of transistor Tr3 and the ground.

Concerning the oscillating circuit structure, the deformation clap oscillating circuit is adopted. That is, the oscillating structure is composed as follows. There is provided a capacitor C34 between the base and the emitter of transistor Tr3. The emitter and the collector of transistor Tr3 are connected with each other as follows. One terminal of capacitor C35 is connected with the emitter of transistor Tr3, and the other terminal of capacitor C35 is connected with ground. Due to the above structure, the emitter is connected with the collector of transistor Tr3 via capacitor C36 which is connected by means of high frequency grounding.

The base and the collector of transistor Tr3 are connected with each other as follows. On the base side of transistor Tr3, there are provided capacitors C31 and C33 and a strip line SL2 which is connected with the capacitors C31, C33. A terminal of capacitor C33, which is not connected with strip line SL2, is connected with the base of transistor Tr3. Terminals of capacitor C31 and strip line SL2, which are not connected with capacitor C33, are connected with ground. Due to the above structure, the base of transistor Tr3 is connected with the collector via capacitor C36 which is connected by means of high frequency grounding. Accordingly, the oscillating frequency, the C/N characteristic of oscillation and the oscillating power are determined by the capacitors and the strip line arranged among the base, emitter and collector of transistor Tr3.

A signal oscillated by the second oscillating stage 200 is sent out from the emitter of transistor Tr3 via capacitor C37 connected with the emitter and inputted into the successive buffer stage via a switch circuit describe later.

Unlike the first oscillating stage 100 described before, there is provided no variable capacitance diode in the above second oscillating stage 200, that is, there is provided no mechanism for controlling the frequency.

The switch circuit is composed as follows. The power supply terminal $V_{cc}2$ is connected with the anode side of the PIN diode Pd via resistor R34 to control an intensity of current. The cathode side of the PIN diode Pd is connected with coil L31 to increase the high frequency impedance. In this case, capacitor C37 is connected with the cathode side of the PIN diode Pd. This capacitor C37 is connected with the emitter of transistor Tr3 arranged in the second oscillating stage 200. This switch circuit is operated as follows. When the electric power is supplied to the power supply terminal $V_{cc}2$, the second oscillating stage 200 starts oscillating. At the same time, the PIN diode Pd arranged in the switch circuit is turned on. Therefore, an oscillating signal, which has passed through capacitor C37, further passes through the PIN diode Pd. After that, the oscillating signal passes through capacitor C38, which is arranged to cut a DC component, and is inputted into the successive buffer stage which also functions as a mixer. Next, when power supply to the power supply terminal $V_{cc}2$ is stopped, the second oscillating stage 200 stops its oscillation, and further the PIN diode Pd is turned off. Therefore, the impedance of the second oscillating stage 200 on the input terminal side is higher than the impedance of the buffer side, that is, the second oscillating stage 200 is put into a condition separate from the buffer stage 300.

Finally, the buffer stage 300 will be explained as follows. In the buffer stage 300, the collector of transistor Tr2 is connected with the power supply line $V_{cc}1$ via coil L11 used as a load of high frequency. A side of coil L11 connected with the power supply terminal $V_{cc}1$ is connected with ground via capacitor C16 by means of high frequency grounding. The emitter of transistor Tr2 is connected with capacitor C18 used for grounding. Due to the above arrangement, the emitter of transistor Tr2 is connected to ground by means of high frequency grounding. The bias circuit is formed into an arrangement referred to as a voltage feedback bias. The voltage feedback bias includes: a resister R14 connected between the power supply terminal $V^{cc}1$ and the base of transistor Tr2; a resistor R15 connected between the base of transistor Tr2 and the round; and a resistor R16 connected between the emitter of transistor Tr2 and the ground.

A signal is outputted from the buffer stage via capacitor C19 connected with the collector of transistor Tr2. A signal of voltage controlled oscillator is outputted from the output terminal $O_{utput}$ connected with an outside circuit. At this time, an output impedance of the signal is adjusted by the combination of constants of capacitor C20, which is connected with the output terminal $O_{utput}$ and the ground, capacitor C19 and coil L11.

In this case, when the second oscillating stage 200 is not operated, that is, when no electric power is supplied to the power supply terminal $V_{cc}2$, the second oscillating stage 200 is separated from the buffer stage 300 by the aforementioned switch circuit. Substantially in the same manner as that of common voltage controlled oscillator, the buffer stage 300 functions as follows. A signal generated by the first oscillating stage 100, the frequency of which is f1, passes through capacitor C17 and inputted into the base of transistor Tr2 in the buffer stage 300, so that the buffer stage 300 functions as a buffer of the first oscillating stage 100. When the second oscillating stage 200 is operated, that is, when electric power is supplied to the power supply terminal $V_{cc}2$, a signal generated by the second oscillating stage 200, the frequency of which is f2, passes through capacitor C38 and is inputted into the emitter of transistor Tr2 in the buffer stage 300.

At this time, mixing occurs in transistor Tr2, so that a signal of (f1+f2) or |f1−f2| is generated by transistor Tr2. At this time, the buffer stage 300 functions as a buffer for both first and second oscillating stages 100 and 200.

In this connection, an output impedance of the output terminal $O_{utput}$ is matched to be a specific value (for example, 50Ω) by the combination of capacitors C19, C20 and coil L11. Usually, this combination to match the impedance can be applied to only one frequency band. However, in the case of voltage controlled oscillator, when impedance matching is excessively conducted on a specific value, it is affected by the fluctuation of impedance of a circuit with which the output terminal $O_{utput}$ is connected, which is generally referred to as a pulling characteristic. Accordingly, design of the circuit is usually conducted in such a manner that the output impedance of the output terminal $O_{utput}$ is somewhat shifted from the specific impedance.

For the above reasons, the combination of capacitors C19, C20 and coil L11 is determined in this example in such a manner that both the oscillating frequency f1 of the first oscillating stage 100 and the frequency (f1+f2) or |f1−f2| obtained by mixing the first and second oscillating stages 100 and 200 are appropriately mismatched with the specific impedance.

Due to the above structure, when power is supplied to the power supply terminal $V_{cc}1$, a signal of the oscillating frequency f1 is oscillated, and the oscillating frequency f1 can be continuously changed by the frequency control terminal $V_{cont}$. Further, when electric power is supplied to the power supply terminal $V_{cc}2$, a signal of the oscillating frequency (f1+f2) or |f1−f2| is oscillated, and further the oscillating frequency (f1+f2) or |f1−f2| can be continuously changed by the frequency control terminal $V_{cont}$. That is, it is possible to obtain voltage controlled oscillator by which signals of different frequency bands can be oscillated.

The present invention is explained above referring to an example. However, it should be noted that the present invention is not limited to the above specific circuit.

The structure of the oscillating and buffer stage of voltage controlled oscillator circuit used in the above example is not limited to the specific structure. It is possible to apply a very common circuit structure having the same function as described above, to the present invention.

The switch circuit used in the second oscillating stage 200 in voltage controlled oscillator circuit of the above example is provided for separating the second oscillating stage 200 from the buffer stage 300. However, when no electric power is supplied to the power supply terminal $V_{cc}2$, the oscillating operation of the second oscillating stage 200 is stopped. Accordingly, it is possible to remove the switch circuit from the second oscillating stage 200 and maintain a connecting condition in which the second oscillating stage 200 is connected with the buffer stage 300 at all times.

In the example explained above, voltage controlled oscillator has two oscillating stages. However, a plurality of oscillating stages may be added to voltage controlled oscillator. Due to the foregoing, it is possible to provide voltage controlled oscillator capable of oscillating a plurality of different oscillating frequency bands.

It is possible to form voltage controlled oscillator explained in the above example into one module so that it can be composed as one component integrated into one body.

Second Embodiment

Figure 3:
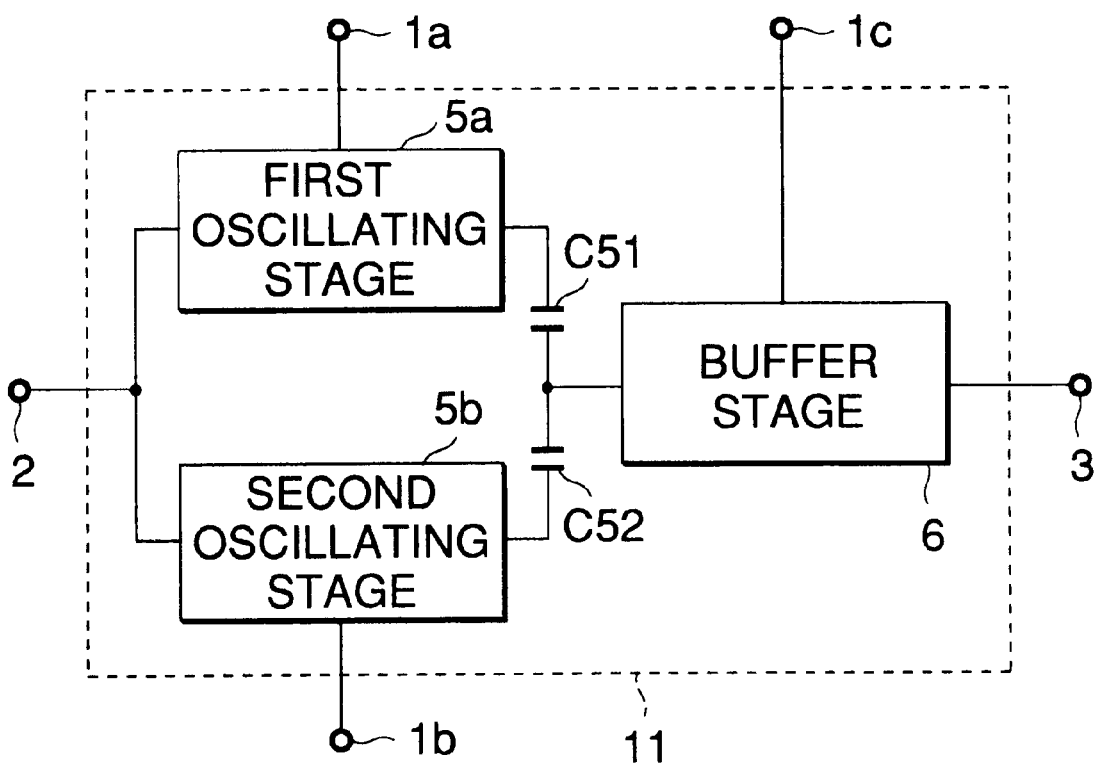
FIG. 3 is a block diagram showing a voltage controlled oscillator according to a second embodiment of the present invention.
Figure 4:
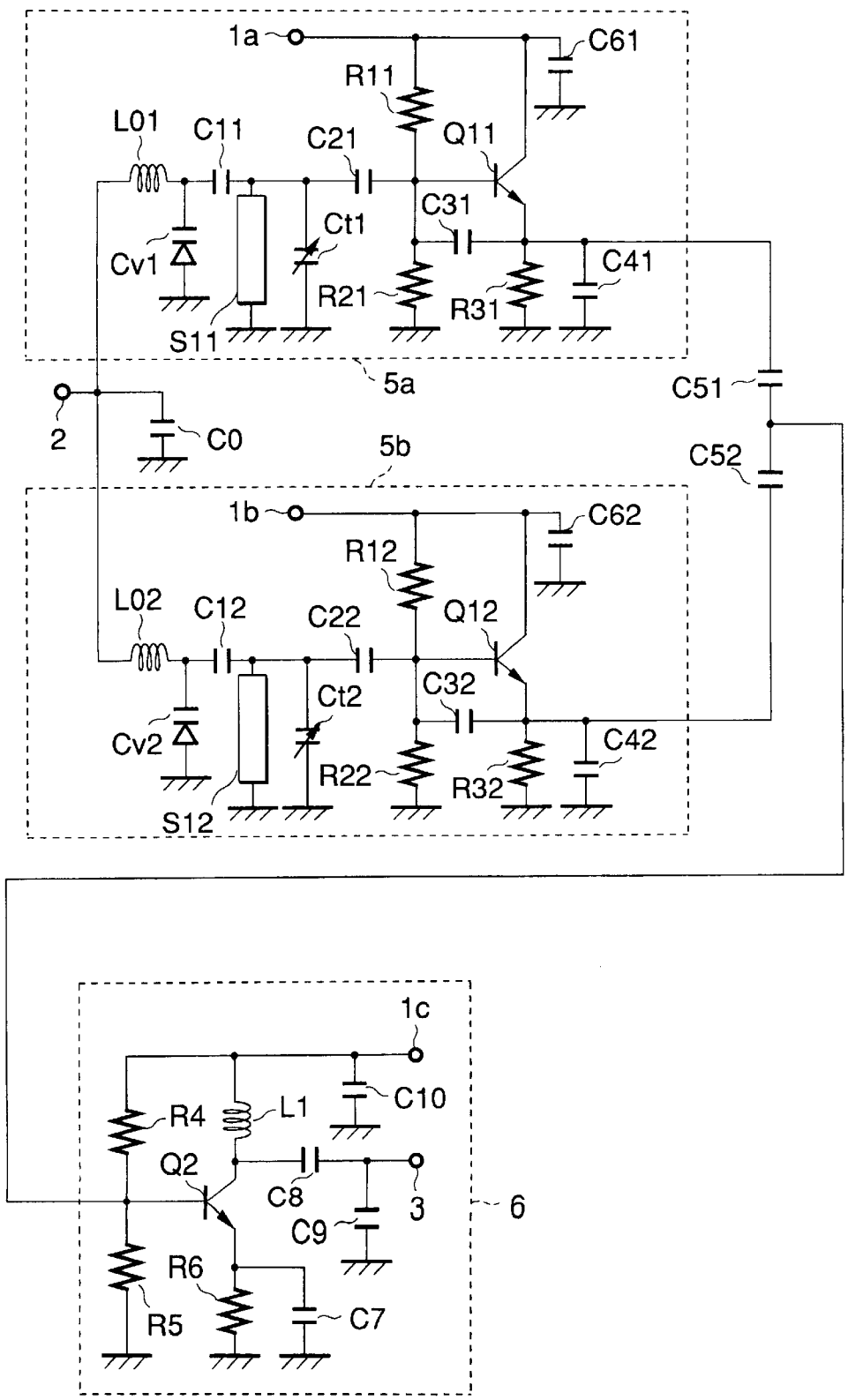
FIG. 4 is a circuit diagram of the voltage controlled oscillator of the second embodiment.
Figure 5:
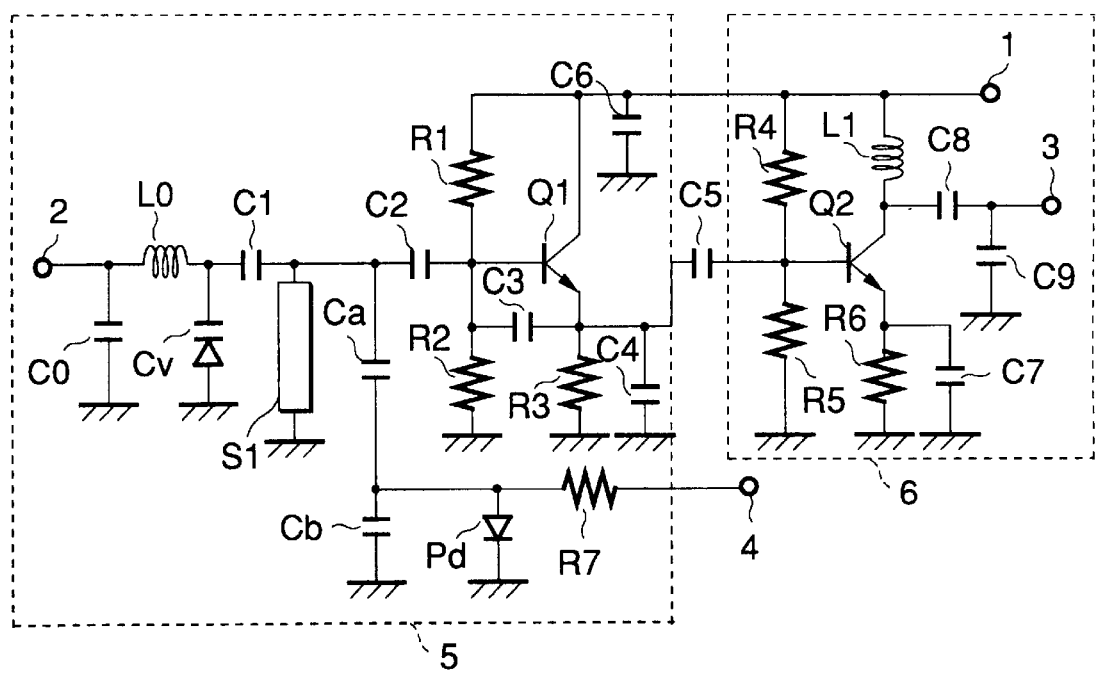
FIG. 5 is a circuit diagram showing the first example of the conventional voltage controlled oscillator.
Figure 6:
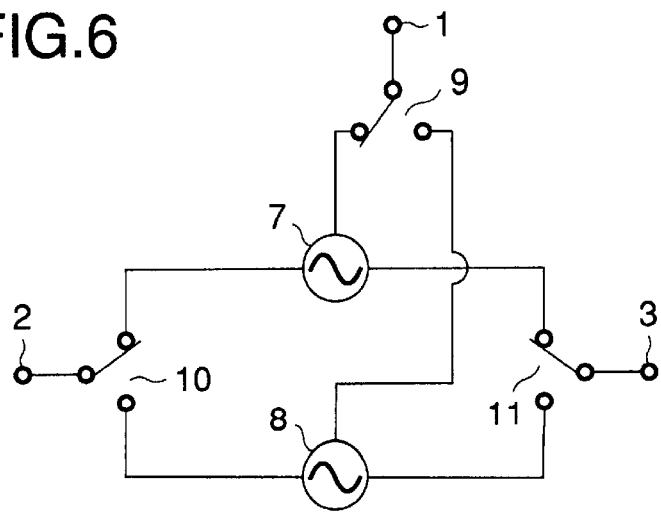
FIG. 6 is a block diagram showing the second example of the conventional voltage controlled oscillator.

FIG. 3 is a block diagram showing an example of the voltage controlled oscillator of the present invention. FIG. 4 is a circuit diagram of the example. In FIG. 3, reference numerals 5a and 5b are oscillating stages to respectively oscillate signals of different frequency bands, and reference numeral 6 is a buffer stage commonly provided on the output sides of these oscillating stages 5a, 5b. Output terminals of the oscillating stages 5a, 5b are respectively connected with the input terminal of the buffer stage 6 via capacitors C51 and C52 of low capacitance. In the way described above, the voltage controlled oscillator 11 is composed. Reference numerals 1a and 1b are respectively power supply terminals of the oscillating stages 5a and 5b. Reference numeral 1c is a power supply terminal of the buffer stage 6. Reference numeral 2 is a frequency control terminal to apply a DC control voltage. Reference numeral 3 is an output terminal to output a high frequency signal.

In the voltage controlled oscillator shown in FIG. 3, when electric power is supplied to the power supply terminal 1a of one oscillating stage 5a and no electric power is supplied to the power supply terminal 1b of the other oscillating stage 5b, only one oscillating stage 5a is operated and the other oscillating stage 5b is not operated. When electric power is supplied to the buffer stage 6 from the power supply terminal 1c, the buffer stage 6 is operated. In this case, a signal of the frequency corresponding to a DC voltage applied upon the frequency control terminal 2 is outputted from the output terminal 3 in a range in which the oscillating stage 5a can oscillate.

On the other hand, when electric power is supplied to the oscillating stage 5b from the power supply terminal 1b and no electric power is supplied to the oscillating stage 5a from the power supply terminal 1a and further electric power is supplied to the buffer stage 6 from the power supply terminal 1c, the output terminal 3 outputs a signal in a frequency band in a range determined by the oscillating stage 5b.

The reason why the above operation is conducted is described as follows. In order to prevent the frequency of a signal from fluctuating in the case of fluctuation of the impedance at the output terminal 3, the common voltage controlled oscillator is designed in such a manner that the oscillating stage and the buffer stage composing the voltage controlled oscillator are loose coupling with each other. Accordingly, there are provided coupling capacitors C51 and C52, the capacitance of which is small, between the oscillating stages 5a, 5b and the buffer stage 6.

In the case where the oscillating stage 5a is operated and the oscillating stage 5b is not operated, a signal oscillated by the oscillating stage 5a passes through capacitor C51 and almost all signal flows into the buffer stage 6, and the signal seldom flows into the oscillating stage 5b via capacitor C52. The reason is that the impedance of capacitor C52 is much higher than the impedance of the input terminal of the buffer stage 6 because capacitors C51 and C52 are arranged for the purpose of loose coupling. In other words, almost all oscillating signal flows into the buffer stage 6, the impedance of which is low. The above circumstances are the same in the case where the oscillating stage 5b is operated and the oscillating stage 5a is stopped. Due to the foregoing, even when a plurality of oscillating stages 5a, 5b are connected with the buffer stage 6, they are not affected by each other.

Next, an example shown in FIG. 4 will be explained as follows. In FIG. 4, R4 to R32 are resistors, C0 to C62 are capacitors, Cv1, Cv2 are variable capacitance diodes, Ct1, Ct2 are capacitors for adjusting the frequency, S11, S12 are strip lines composing a resonator, L01, L02, L1 are coils, and Q11, Q12, Q2 are transistors. Other reference numerals are the same as those described before.

As described above, in this example, the oscillating stage is composed of two oscillating stages 5a, 5b. Output terminals of these oscillating stages 5a, 5b are connected with the input terminal of the buffer stage 6 via capacitors C51, C52 arranged for accomplishing a loose coupling.

First, the oscillating stage 5a will be explained in detail. The collector of transistor Q11 in the oscillating stage 5a is directly connected with the power supply terminal 1a. Further, the collector of transistor Q11 is connected with ground via capacitor C61. The bias circuit of transistor Q11 is formed into an arrangement referred to as a voltage feedback bias. The voltage feedback bias includes: a resister R11 connected between the power supply terminal 1a and the base of transistor Q11; a resistor R21 connected between the base of transistor Q11 and ground; and a resistor R31 connected between the emitter of transistor Q11 and ground.

Capacitor C31 is interposed between the base and the emitter of transistor Q11. Capacitor C41 is interposed between the emitter of transistor Q11 and ground. Due to the above arrangement, the emitter and the collector of transistor Q11 are connected with each other by capacitors C41 and C61 described before.

Between the base of transistor Q11 and ground, there are provided a capacitor C21, a capacitor C11 and a variable capacitance diode Cv1 which are connected in series. Between the connecting point of capacitors C21, C11 and ground, there are provided a strip line S11 and capacitor Ct1 for adjusting the frequency which are connected in parallel. The aforementioned capacitor C61 is connected to ground. The collector of transistor Q11 is connected to ground via the aforementioned capacitor C61. After all, the base and the collector of transistor Q11 are connected with each other by a circuit including capacitors C21, C11, Cv1, Ct1, strip line S11 and capacitor C61.

Accordingly, the oscillating frequency, the C/N characteristic of oscillation and the oscillating power are determined by the capacitors and the strip line arranged among the terminals of the base, emitter and collector of transistor Q11. A signal oscillated by the oscillating stage 5a is sent out from the emitter of transistor Q11 via capacitor C51 connected with the emitter and inputted into the successive buffer stage 6.

On the other hand, when a controlled DC voltage is applied upon the variable capacitance diode Cv1 by the frequency control terminal 2, the capacitance of the variable capacitance diode Cv1 is changed to a capacitance corresponding to the DC voltage, so that the oscillating frequency of the oscillating stage 5a is controlled. There is provided a capacitor C0 between the line, which connects the frequency control terminal 2 with the cathode of the variable capacitance diode Cv1, and ground. Also, there is provided a coil L01 inserted into the line. An oscillating signal oscillated in the oscillating stage 5a is prevented from flowing outside by the action of capacitor C0 and coil L01 described above. A high frequency signal sent from the outside is prevented from intruding into the oscillating stage 5a by the action of capacitor C0 and coil L01 described above. That is, capacitor C0 and coil L01 are arranged for the purpose of decoupling. Constants of respective capacitor C0 and coil L01 are determined to accomplish the above function. In this connection, coil L01 may affect the oscillating frequency depending upon the setting of its constant.

In the case of a commonly mass-produced voltage controlled oscillator, it is necessary to maintain the fluctuation in the oscillating frequency to be in a range not more than 0.1%. In order to accomplish the above object, the oscillating frequency of the oscillating stage 5a is adjusted by adjusting the capacitance of the frequency adjusting capacitor Ct1 in the mass production line.

The essential structure of the other oscillating stage 5b is the same as that of the oscillating stage 5a described above. In other words, only the constant of each element of the oscillating stage 5b is different from that of the oscillating stage 5a, and the circuit structure and the operation are entirely the same. Therefore, the explanation of the oscillating stage 5b will be omitted here. In this connection, the oscillating frequency of the oscillating stage 5b is controlled when a DC voltage applied upon the frequency control terminal 2 is controlled in the same manner as that of the oscillating stage 5a. Capacitor C0 connected with the frequency control terminal 2 is commonly used between the oscillating stages 5a and 5b.

Next, the buffer stage 6 will be explained below. The power supply terminal 1c of transistor Q2 of the buffer stage 6 is connected with the collector of transistor Q2 via coil L1 which is used as a high frequency load. Also, the power supply terminal 1c is grounded via capacitor C10 by means of high frequency grounding. The emitter of transistor Q2 is connected with capacitor C7 used for grounding. Therefore, the emitter of transistor Q2 is grounded by means of high frequency grounding. The bias circuit of transistor Q2 is formed into an arrangement referred to as a voltage feedback bias. The voltage feedback bias includes: a resister R4 connected between the power supply terminal 1c and the base of transistor Q2; a resistor R5 connected between the base of transistor Q2 and ground; and a resistor R6 connected between the emitter of transistor Q2 and ground.

A signal of the buffer stage 6 is sent to the output terminal 3, which is connected to an outside circuit, via capacitor C8 connected with the collector of transistor Q2. Then the signal is outputted from the output terminal 3 as an output signal of the voltage controlled oscillator. At this time, an impedance of the output signal is adjusted by the combination of constants of capacitor C9, which is interposed between the output terminal 3 and ground, capacitor C8 and coil L1.

Next, the operation of the circuit shown in FIG. 4 will be explained as follows. First, electric power is supplied to the power supply terminals 1a, 1c when switches not shown in the drawing are turned on, and no electric power is supplied to the power supply terminal 1b. In the above stage, only one oscillating stage 5a is operated and the other oscillating stage 5b is not operated. A signal generated by the oscillating stage 5a passes through capacitor C51 and is inputted into the base of transistor Q2 in the buffer stage 6. Therefore, the buffer stage functions as a buffer of the oscillating stage 5a. The frequency of the outputted signal is controlled by a DC voltage applied upon the frequency control terminal 2.

Electric power supply to the power supply terminal 1c is continued, and no electric power is supplied to the power supply terminal 1a. Under the above state, electric power is supplied to the power supply terminal 1b. Then, only the oscillating stage 5b and the buffer stage 6 are operated. A signal generated by the oscillating stage 5b passes through capacitor C52 and is inputted into the base of transistor Q2 in the buffer stage 6. Therefore, the buffer stage functions as a buffer of the oscillating stage 5b. The frequency of the outputted signal is controlled by a DC voltage applied upon the frequency control terminal 2 in the same manner as that of the oscillating stage 5a.

In this example, DC control voltage is applied upon the variable capacitance diodes Cv1, Cv2 of the oscillating stages 5a, 5b by the frequency control terminal 2. However, when DC voltage is applied upon the variable capacitance diodes Cv1, Cv2, an electric current, the intensity of which is only several $\mu$A, flows in each variable capacitance diode. Therefore, it is possible to assume the variable capacitance diodes Cv1, Cv2 as insulators. For the above reasons, even when DC control voltage is applied upon an oscillating stage which is not operated, voltage drop seldom occurs. Therefore, it is possible to apply DC control voltage upon the oscillating stage, which is operated, without causing any problem. Even when the oscillating stage is not operated, only Cv1 or Cv2 is operated. As described before, the oscillating stages 5a, 5b are connected with the buffer stage 6 through the capacitors C51, C52 by means of loose coupling. Accordingly, there is no possibility that the oscillating stage 5b or 5a, which is operated, is affected by the operation of the variable capacitance diode Cv1 or Cv2, which is not operated, in the oscillating stage 5a or 5b.

Concerning C/N characteristic which is an important characteristic of the voltage controlled oscillator, since the oscillating stages 5a, 5b are electrically independent from each other as described before, it is possible to optimize the C/N characteristic by adjusting the element constants in accordance with the frequencies oscillated by the respective oscillating stages 5a, 5b.

As described before, when the oscillating frequency of the voltage controlled oscillator is adjusted in the mass production line, it is possible to adjust the oscillating stages 5a, 5b independently. Therefore, it is unnecessary to adopt a complicated method in which adjustment is conducted while consideration is given to the oscillating frequencies of both oscillating stages so that both can be well-balanced to enhance the accuracy of the oscillating frequencies.

In this connection, an output impedance of the output terminal 3 is matched to be a specific value such as 50 Ω by the combination of capacitors C8, C9 and coil L1. Usually, this combination to match the impedance can be applied to only one frequency band. However, in the case of a voltage controlled oscillator, when impedance matching is excessively conducted on a specific value, it is affected by the fluctuation of impedance of a circuit with which the output terminal 3 is connected, which is generally referred to as a pulling characteristic. Accordingly, design of the circuit is usually conducted in such a manner that the output impedance of the output terminal 3 is somewhat shifted from the specific impedance. For the above reasons, the combination of capacitors C8, C9 and coil L1 is determined in this example in such a manner that both the oscillating frequency of the oscillating stage 5a and the oscillating frequency of the oscillating stage 5b are appropriately mismatched with the specific impedance.

Due to the structure described above, it is possible to provide a voltage controlled oscillator characterized in that: the buffer stage 6 is commonly used among a plurality of oscillating stages (two oscillating stages in this example); and when electric power supply is changed over between the power supply terminals 1a and 1b, one of the plurality of oscillating frequency bands can be selectively outputted.

Embodiments of the present invention are explained above.

The circuit structure of the above oscillating stage and buffer stage is a structure commonly used. Even when other circuit structure is adopted, the voltage controlled oscillator of the present invention can be realized. In the above example, two oscillating stages are provided, however, not less than three oscillating stages may be provided. When not less than three oscillating stages are provided, it becomes possible to extend a range of the oscillating frequencies. It is possible to form the voltage controlled oscillator explained in the above example into one module so that it can be composed as one component integrated into one body.

According to the present invention, a plurality of oscillating stages are roughly connected with a buffer stage by means of capacitive coupling of low capacitance. Therefore, the oscillating stages can be independently changed over when they are operated. Accordingly, design and adjustment of the oscillating frequency band of respective oscillating stage can be freely and easily conducted.

Characteristics such as C/N characteristic of signals in a plurality of different frequency bands can be independently designed in the respective frequency bands. Therefore, the characteristic can be easily designed.

Since the oscillating stage and the buffer stage are connected with each other by means of capacitance coupling, the switch circuit can be simplified. Therefore, the size of the voltage controlled oscillator can be reduced. It is unnecessary to provide a complicated wiring in the circuit into which this voltage controlled oscillator is incorporated. Further, it is possible to reduce a space in which the voltage controlled oscillator is arranged.

According to the present invention, when the power supply terminals of a plurality of oscillating stages are respectively turned on and off, the oscillating signal of the oscillating stage to be inputted into the buffer stage can be selected. Therefore, it is possible to select the oscillating stage only when the power supply is turned on and off.

According to the present invention, the frequency control terminal is arranged commonly among the oscillating stages, and each oscillating stage is provided with a variable capacitance diode, the capacity of which is changed in accordance with DC application voltage, so that the oscillating frequency can be changed. Accordingly, it is not necessary to provide a changeover switch of DC application voltage, and the switch circuit can be simplified.

What is claimed is:

1. A voltage controlled oscillator which is operable at plural frequency bands, comprising:
   a first oscillating stage configured to output a first frequency signal, the first oscillating stage having a frequency control terminal to which a control voltage is applied so as to continuously change a frequency of the first frequency signal;
   a second oscillating stage configured to selectively output a second frequency signal different from said first frequency signal;
   a buffer stage connected to receive and mix said first and second frequency signals to generate a mixed output signal;
   wherein said first oscillating stage is directly connected with the buffer stage so as to always feed the first frequency signal to the buffer stage and said second oscillating stage is connected with the buffer stage via a switch configured to respond whenever a voltage from a source is supplied to an input of the second oscillator stage to drive the second oscillator stage to selectively feed the second frequency signal to the buffer stage.

2. A voltage controlled oscillator comprising:
   a plurality of oscillating stages, each of the oscillating stages being configured to oscillate signals in different frequency bands;
   one buffer stage connected with all of the plurality of oscillating stages; and
   wherein output terminals associated with each of the plurality of oscillating stages are respectively connected with an input terminal of the buffer stage through a capacitive coupling so as to provide loose coupling between each of the plurality of oscillating stages and the input of the buffer stage which has low capacitance.

3. A voltage controlled oscillator according to claim 2, wherein one oscillating stage, the output of which is inputted into the buffer stage, is selected from a plurality of oscillating stages by turning on and off a power source terminal of the oscillating stage.

4. A voltage controlled oscillator according to claim 3, wherein each oscillating stage has a variable capacitance diode having a variable capacitance which is controlled by an applied voltage to control the oscillating frequency of each oscillating stage, and one frequency control terminal is connected with the variable capacitance diode of each oscillating stage.

* * * * *